US007031859B2

(12) United States Patent
Piesinger

(10) Patent No.: US 7,031,859 B2
(45) Date of Patent: Apr. 18, 2006

(54) APPARATUS AND METHOD FOR IDENTIFYING CABLE PHASE IN A THREE-PHASE POWER DISTRIBUTION NETWORK

(76) Inventor: Gregory H. Piesinger, 6225 E. Saguaro Vista Ct., Cave Creek, AZ (US) 85331

( * ) Notice: Subject to any disclaimer, the term of this patent is extended or adjusted under 35 U.S.C. 154(b) by 7 days.

(21) Appl. No.: 10/492,921

(22) PCT Filed: Mar. 10, 2003

(86) PCT No.: PCT/US03/07199

§ 371 (c)(1),
(2), (4) Date: Apr. 14, 2004

(87) PCT Pub. No.: WO03/079512

PCT Pub. Date: Sep. 25, 2003

(65) Prior Publication Data

US 2004/0263147 A1    Dec. 30, 2004

Related U.S. Application Data

(63) Continuation-in-part of application No. 10/317,910, filed on Dec. 12, 2002, now Pat. No. 6,667,610.

(60) Provisional application No. 60/363,076, filed on Mar. 11, 2002.

(51) Int. Cl.
*G01R 25/00* (2006.01)

(52) U.S. Cl. .......................... 702/72; 702/188; 324/66

(58) Field of Classification Search .................. 702/57, 702/60, 61, 62, 71, 72, 187; 324/66, 86, 324/107, 76.52, 76.77; 700/286, 294
See application file for complete search history.

(56) References Cited

U.S. PATENT DOCUMENTS

| 3,027,513 A | | 3/1962 | Mulavey et al. |
|---|---|---|---|
| 3,829,765 A | | 8/1974 | Siler |
| 4,626,622 A | | 12/1986 | Bouvrette |
| 4,852,174 A | | 7/1989 | Bouchard |
| 5,055,769 A | | 10/1991 | Gentile |
| 5,072,403 A | | 12/1991 | Johns |
| 5,467,011 A | | 11/1995 | Hunt |
| 5,510,700 A | | 4/1996 | Pomatto |
| 5,521,491 A | * | 5/1996 | Najam .................. 324/86 |
| 5,617,329 A | | 4/1997 | Allison et al. |
| 5,748,104 A | * | 5/1998 | Argyroudis et al. ... 340/870.11 |
| 5,995,911 A | | 11/1999 | Hart |

(Continued)

OTHER PUBLICATIONS

"Satellite Phasing Unit: FC4000 User's Manual" ndb Technologie Inc., Feb. 4, 2004.

(Continued)

*Primary Examiner*—Marc S. Hoff
*Assistant Examiner*—Manuel L Barbee

(57) ABSTRACT

A line phase identification system and method identifies the phase of a power line at a remote unknown-phase line (160) in a three-phase power distribution network (100). The instantaneous phase of a known-phase line (150) is measured and saved each GPS second using a 1-pps time mark of a GPS receiver (660). The instantaneous phase at the unknown-phase line (160) is measured at a single GPS second using the 1-pps time mark of a GPS receiver (660) and compared to the phase measurement taken from the known-phase line (150) at the same GPS second. The differential phase between these simultaneously taken known and unknown instantaneous phases will be close to either 0, +120, or −120 degrees, thus identifying the line phase at the line under test (160).

37 Claims, 5 Drawing Sheets

U.S. PATENT DOCUMENTS 6,130,531 A * 10/2000 Hao .......................... 324/85
6,642,700 B1 11/2003 Slade et al.

OTHER PUBLICATIONS

FC4000 Satellite Phasing Unit Users Guide, Radiodetection, pp. 3-17, Feb. 4, 2201.
Ndb Technologie, inc. archived web page, Feb. 1, 2001.
NDB website: http://www.ndb.qc.ca/English/produits/fc4000.htm (pp. 1-3), Feb. 25, 2002.
Department of Energy WAMS Technology Evaluation and Demonstration, pp. 7-5 through 7-11 and 8-12 and 9-8, Jan. 27, 2001.
1993 IEEE International Frequency Control Symposium Precise Timing in Electric Power Systems, Kenneth E. Martin, Bonneville Power Administration, pp. 15-22.
IEEE Transactions on Power Delivery, IEEE Standard for Synchrophasers for Power Systems, K.E. Martin, et al., Jan. 1998, vol. 13, No. 1 pp. 73-77.

* cited by examiner

TS = TRANSMISSION SUBSTATION TRANSFORMER
DS = DISTRIBUTION SUBSTATION TRANSFORMER
PM = POLE OR PAD MOUNT TRANSFORMER

400

500

APPARATUS AND METHOD FOR IDENTIFYING CABLE PHASE IN A THREE-PHASE POWER DISTRIBUTION NETWORK

RELATED APPLICATIONS

The present patent is a United States National Conversion of "Apparatus and Method for Identifying Cable Phase in a Three-Phase Power Distribution Network," PCT Application No. PCT/US2003/007199, which is a continuation-in-part of "Apparatus and Method for Identifying Cable Phase in a Three-Phase Power Distribution Network,", U.S. patent application Ser. No. 10/317,910, filed on 12 Dec. 2002, now U.S. Pat. No. 6,667,610 B2, which is incorporated herein by reference.

The present invention claims benefit under 35 U.S.C. §119(e) to "Apparatus and Method for Determining Identifying Cable Phase in a 3-Phase Power Distribution Network," U.S. Provisional Patent Application Ser. No. 60/363,076 filed 11 Mar. 2002, which is incorporated by reference herein.

TECHNICAL FIELD

The present invention relates to the field of three-phase power distribution networks. More specifically, the present invention relates to the field of identifying the phase of a power line in a three-phase power distribution network.

BACKGROUND ART

Electric power distribution networks are used by the electric utilities to deliver electricity from generating plants to customers. The actual distribution voltages will vary from country to country and from utility to utility within a given country. In a typical power distribution network in the U.S., three-phase power at a high voltage (e.g., 345 kilovolts phase-to-phase) is delivered to multiple transmission substations. At these transmission substations, this high-voltage power is stepped down to an intermediate three-phase voltage (e.g., 69 kilovolts phase-to-phase). The intermediate-voltage three-phase power from each transmission substation is then delivered to multiple distribution substations. At the distribution substations, the intermediate-voltage is stepped down to a lower distribution voltage (e.g., 12.47 kilovolts phase-to-phase) and separated into three single-phase feeder lines (e.g., 7.2 kilovolts phase-to-ground). Each of these feeder lines branches into multiple circuits to power a plurality of local pole-mounted or pad-mounted transformers that step the voltage down to a final single-phase voltage of 120 and 240 volts for delivery to the commercial and residential customers.

Ideally, the utilities try to initially design the feeder circuits such that the loads are balanced, i.e., the current loads on each single-phase output of a three-phase transformer are equal. However, over time, as customers are added and removed, the loads on each single-phase output may change and become unbalanced. To re-balance the loads, some of the branch circuits are typically moved from a more heavily loaded phase to a more lightly loaded phase.

To re-balance the loading, the phase of each line in a distribution cabinet must be accurately known. Otherwise, a line may be erroneously removed from a more lightly loaded phase and placed on a more heavily loaded phase. If this happens, the procedure will have to be repeated, which will cause a second disruption in service to all customers on the branch being re-phased. In the worst case, adding a greater load to the more heavily loaded phase may cause a substation fuse to blow, resulting in a power outage for all customers on the overloaded phase.

Currently, to accurately identify the phase of a particular feeder branch, utility company personnel must physically trace a line run back through various distribution cabinets until they reach a point in the distribution network at which the phase is definitely known. This can be a time consuming, labor-intensive process.

Various devices and methods have been described to assist in the phase identification of lines. Bouvrette, U.S. Pat. No. 4,626,622, proposes using modems and telephone lines to establish a communication link. A signal associated with the phase at a point in the network where the phase of the line is known (the reference line) is transmitted over the communication link to a point in the network where the phase of the line is not known (the line under test). Difficulties arise with this methodology in that delays in the communication link may severely affect the accuracy of the phase measurement.

Pomatto, U.S. Pat. No. 5,510,700, proposes a similar scheme to that of Bouvrette save that the communication link uses radio transmissions to eliminate communication-link delay problems. However, both Bouvrette and Pomatto require calibration procedures and special training for their techniques to be used effectively.

Hao, U.S. Pat. No. 6,130,531, proposes a method and apparatus to compare phases between electric power system substations in real time. His method is similar to that of Bouvrette and Pomatto except that Hao uses a time base locked to Global Positioning System (GPS) time at both the reference line and the line under test to eliminate delay and synchronization problems.

Finally, a phase identification instrument is currently available that, like Hao, uses GPS receivers at both the reference line and the line under test to eliminate delay and synchronization problems, and, like Bouvrette, uses a cellular data communication link to convey the phase of the reference line to the line under test location. This instrument transmits the instantaneous phase of the reference line once each GPS second. The instantaneous phase of the line under test is measured at a given second, then compared to the phase of the reference line for that same second. All communication and readings are performed in the same one-second interval. This necessitates communication delay is less than one second.

In all these approaches, a pre-established real-time communication link is required. That is, a communication link needs be established and active at the time the phase of the line under test is measured. This renders these approaches unusable wherever and whenever the communication link cannot be established. Also, since the phase of the line under test is determined for each measurement, the measuring apparatus must be retrieved after each test. This precludes the ability to make several different tests before accessing the apparatus, e.g., measuring the phases of several different overhead lines in a substation before lowering the "hot stick" to which the apparatus is attached.

Accordingly, it is the object of the present invention to provide a new and improved apparatus and method for the identification of line phase of a power line in a three-phase power distribution network. The apparatus and method do not require a pre-established real-time communication link, do not suffer from communication delay and synchronization difficulties, do not require calibration procedures to be performed, and do not require special training on the part of the operator.

DISCLOSURE OF INVENTION

Briefly, to achieve the desired object of the present invention, Global Positioning System (GPS) receivers are used at both the known and unknown phase locations in the power distribution network to time-correlate phase information, thereby identifying the phase of the line in question.

Specifically, using the 1 pps (one pulse per second) GPS signal, phase information for the known phase will be recorded at each GPS second and entered into a computer. A worker at the unknown phase location will simultaneously also record the line phase information at a particular 1 pps GPS second on a phase identification meter that will convert the recorded time and phase to a short alpha or numeric sequence. The worker will then give that sequence to the dispatcher. The dispatcher will determine the phase by entering the sequence received from the worker into the computer. The dispatcher will then relay the line phase designation back to the worker.

Alternatively, the worker can simply write down or otherwise record the sequence and relate it to the dispatcher at a later time. In both cases, no real time communication link is required.

In this way, the worker determines the line phase by taking a simple meter measurement in much the same way voltage and current measurements are taken. Therefore, no special procedures or training is required on the part of the worker.

BRIEF DESCRIPTION OF DRAWINGS

A more complete understanding of the present invention may be derived by referring to the detailed description and claims when considered in connection with the Figures, wherein:

BEST MODE FOR CARRYING OUT THE INVENTION

This discussion is concerned with power distribution at both 60 and 50 Hertz (Hz). To avoid confusion, all references to parameters of 50-Hz systems will be bracketed and will follow the same parameters for 60-Hz systems. For example, the phrase "for power at 60 [50] Hz, each cycle takes 16.67 [20.0] milliseconds" indicates that in a 60-Hz system each cycle takes 16.67 milliseconds, while in a 50-Hz system each cycle takes 20.0 milliseconds.

Also, it will be noted that in the preferred embodiments discussed herein mention is made of 120-volt and 240-volt commercial and residential voltages. Those skilled in the art will appreciate that these voltages are standard in the U.S. The use of other voltages, such as the 230-volt E.U. standard, does not depart from the spirit of the present invention.

The goal of the present invention is to provide the utility worker with an easy to use phase identification apparatus and method for identifying the phase of a line in a three-phase power distribution network 100.

Figure 1:
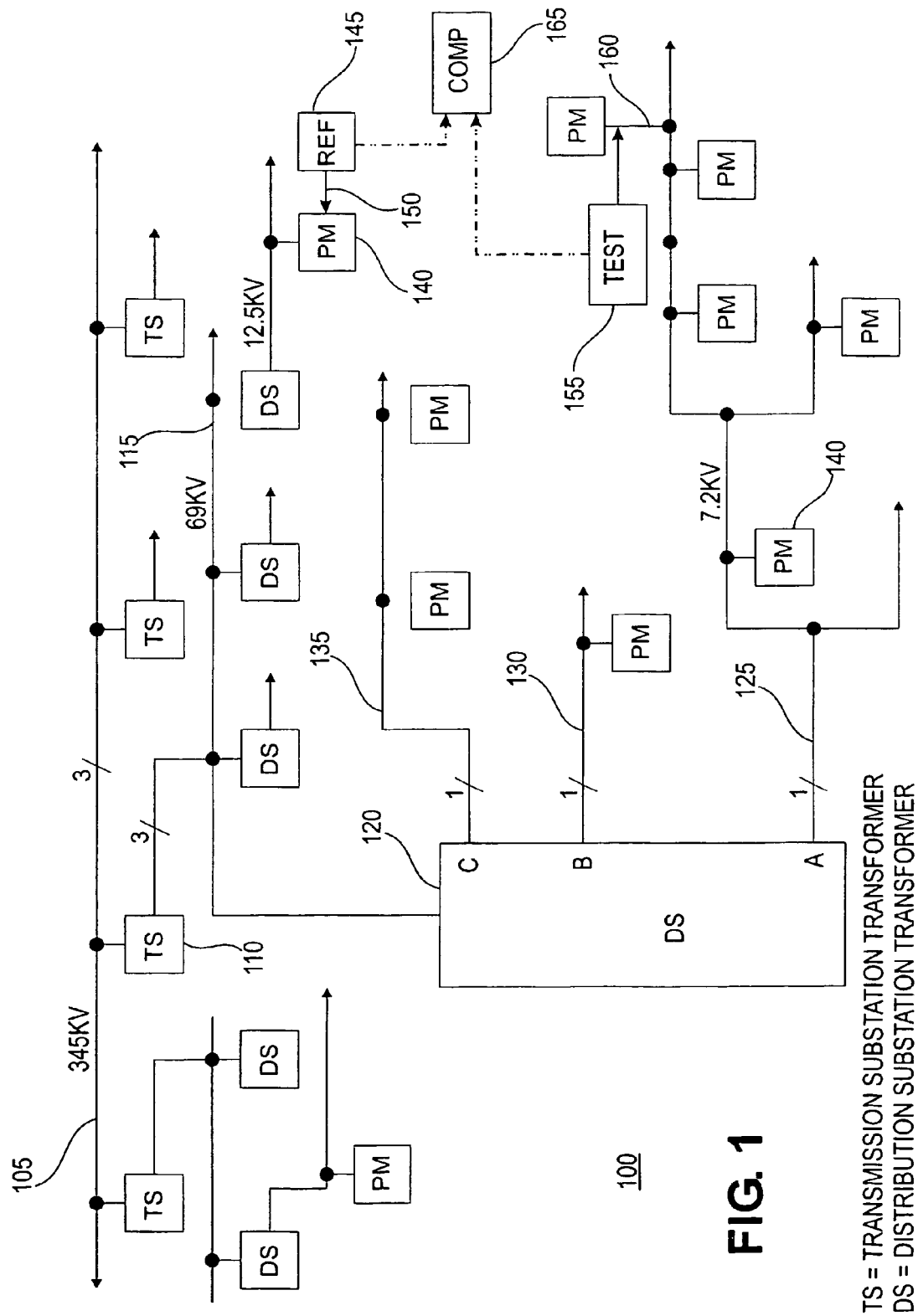
FIG. 1 is a schematic diagram of a typical power distribution network in accordance with a preferred embodiment of the present invention.

FIG. 1 is a schematic diagram of a typical power distribution network 100 in accordance with a preferred embodiment of the present invention. The following discussion refers to FIG. 1.

In power distribution network 100, three-phase power lines 105 at 345 kilovolts feed a series of transmission substation (TS) transformers 110 spread out over a large geographical area. The 69-kilovolt outputs 115 of TS transformers 110 are connected to a series of distribution substation (DS) transformers 120 situated over a smaller geographical area. The 7.2-kilovolt phase-to-ground (12.5-kilovolt phase-to-phase) phase-A feeder output 125 of a DS transformer 120 powers a local distribution network, which contains a number of pole-mounted or pad-mounted (PM) transformers 140 that are used to provide the final 120/240-volt power to the commercial or residential customers. In the same manner, phase-B feeder output 130 of transformer 120 powers another local distribution network, while phase-C feeder output 135 powers a third local network.

At some location in the power distribution network 100, a given PM transformer 140 is used to provide a low-voltage input reference of phase A, B, or C to a permanently attached reference phase identification meter 145 (hereinafter reference meter 145). This reference meter 145 most likely will be situated in the dispatch facility. Reference meter 145 is connected to an output 150 of given PM transformer 140, i.e., to a reference line 150 having a known phase. The purpose of reference meter 145 is to provide a reference of phase A, B, or C that can be used to determine the unknown phase of a line at any other location in network 100. A worker at a remote location uses another phase identification meter 155 (hereinafter test meter 155) to momentarily probe the voltage on the line under test 160, i.e., the line whose phase is to be determined.

Figure 2:
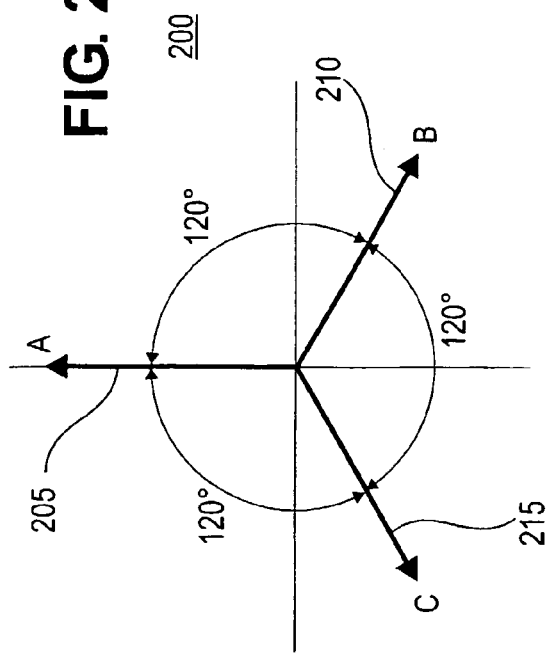
FIG. 2 is a phasor diagram of voltage phase relationships in a three-phase power network in accordance with a preferred embodiment of the present invention.
Figure 3:
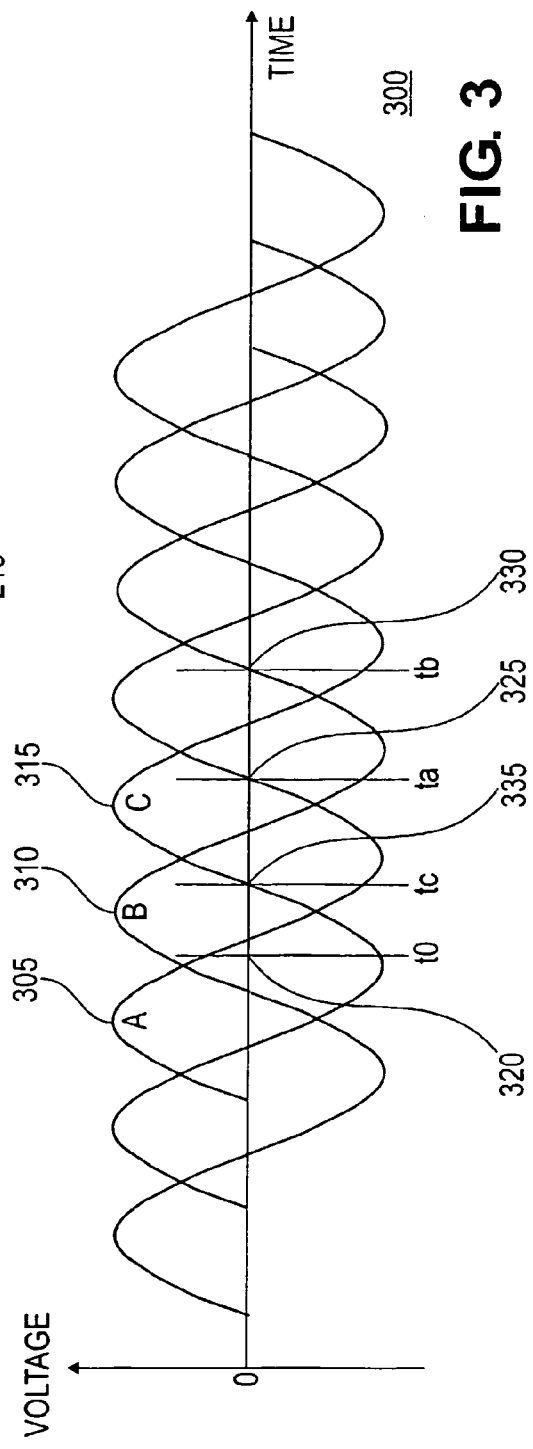
FIG. 3 is a voltage versus time diagram of voltage phase relationships in a three-phase power network in accordance with a preferred embodiment of the present invention.

FIGS. 2 and 3 depict line phase relationships in three-phase power network 100 as a phasor diagram (FIG. 2) and a voltage versus time diagram (FIG. 3) in accordance with a preferred embodiment of the present invention. The following discussion refers to FIGS. 1, 2, and 3.

Phasor diagram 200 illustrates the phase relationship between phases A, B, and C in three-phase power distribution network 100. Phasor diagram 200 represents phase A as phasor 205 at 0 degrees, phase B as phasor 210 at 120 degrees, and phase C as phasor 215 at 240 degrees. In 60-Hz [50-Hz] power network 100, the entire phase diagram rotates at a rate of 60 [50] revolutions per second but the phase differences between adjacent phases A, B, and C remains a constant 120 degrees. Each revolution of the phase diagram represents 360 degrees of phase rotation by the voltage phasors.

Because phase is rotational, each phase may be said to both lead and lag each other phase. Phase A leads phase B by 120 degrees, leads phase C by 240 degrees, lags phase C by 120 degrees, and lags phase B by 240 degrees. Phase B leads phase C by 120 degrees, leads phase A by 240 degrees, lags phase A by 120 degrees, and lags phase C by 240 degrees. And phase C leads phase A by 120 degrees, leads phase B by 240 degrees, lags phase B by 120 degrees, and lags phase A by 240 degrees. This may be clearly seen in phasor diagram 200.

Voltage versus time diagram 300 depicts the same phase relationships as phasor diagram 200. To complete a single 360-degree cycle of phase rotation, the voltage of each phase starts at zero volts, peaks in the positive direction, returns to zero volts, peaks in the negative direction, and again returns to zero volts. Phase A, B, and C are represented by voltage waveforms 305, 310, and 315 respectively.

For power at 60 [50] Hz, each cycle takes 16.67 [20.00] milliseconds to complete a 360-degree cycle. This is equivalent to 46.3 [55.56] microseconds per degree or 5.55 [6.67] milliseconds for 120 degrees. Therefore, phases A, B, and C are separated in time by 5.55 [6.67] milliseconds.

Since the frequency of 60-Hz [50-Hz] power distribution network 100 is so low, there is very little voltage phase shift between two points on the same phase anywhere in network 100. That is, if one were to observe the voltage waveforms of phase A at widely separated points in network 100, all voltages would pass through a predetermined voltage in a predetermined direction at substantially the same time. In the preferred embodiment, the predetermined voltage is zero volts and the predetermined direction is rising, i.e., from negative to positive. That is, all voltages would rise though zero volts at substantially the same time.

In the present invention, the phase of the voltage waveforms at two widely separated points in power distribution network 100 are observed and compared at substantially the same instant. Desirably, this is accomplished by using standardized precision time signals, such as those from the Global Positioning System (GPS). The use of such precision time signals allows all operators to have a precise time correlation so that an instantaneous phase measurement can be taken at different locations in network 100 at substantially the same time. The time marks in FIG. 3 illustrate the method by which the unknown phase on line under test 160 can be determined.

Those skilled in the art will appreciate that the phrase "instantaneous phase" is taken to mean the phase of each sample synchronized to start at substantially the same instant. The absolute time require to take each sample is irrelevant to this discussion. It will also be appreciated that a determination of phase may be performed in any of numerous ways well known to those skilled in the art, including, but not limited to, the time duration methodology discussed herein.

Assume that a timer is started at some instant of time t0 (a start time 320). At reference line 150 (assumed here to be connected to phase A), the timer is stopped when phase A voltage rises through zero volts. This represents a time interval ta 325 since time t0. Since the time difference between phases is 5.55 [6.67] milliseconds, time interval tb 330 of phase B and time interval tc 335 of phase C can be calculated directly without having to actually measure the voltage on phases B and C.

At line under test 160, the point of unknown phase, a similar timer is also started at the same instant of time t0 (start time 320). The timer is stopped when the voltage rises through zero volts. This represents a time interval tx (not shown). The time interval tx will be substantially equal to one of the time intervals ta, tb, or tc, depending on whether the phase of the line under test is A, B, or C, respectively. Therefore, the unknown phase of line under test 160 may be determined by comparing the time interval of the test meter 155 to that of reference meter 145.

There is no need for the unknown phase to be computed during the same 1-second interval in which the data is gathered. If start time t0 320 is recorded, time interval ta 325, tb 330, or tc 335 of reference meter 145 is recorded, and the time interval tx of test meter 155 is recorded, then the unknown phase of line under test 160 may be computed at any time in the future, even hours or days later. This method is superior to the prior art mentioned earlier because a real-time communication link for the transmission of reference line phase data from the reference site to the remote site is not required. By not requiring a real-time communication link, all problems associated with such a link (e.g., delay, synchronization, interference, obstruction, etc.) are avoided.

In the preferred embodiment, start time to 320 is determined by the GPS time. That is, start time t0 320 is preferably equal to or a fixed delay after a GPS time 1-second tick. Those skilled in the art will appreciate, however, that there are methodologies other than the GPS that may be used to establish start time t0 320. The use of one of these other methodologies does not depart from the spirit of the present invention.

The GPS allows phase data to be gathered and recorded at both reference line 150 and line under test 160 at substantially the same start time t0 320. In the preferred embodiment, repetitive trigger signals based upon the GPS I-second ticks are received by reference meter 145. Reference phase data (phase data of reference line 150) is obtained for each trigger signal and recorded by reference meter 145. This database of reference phase data is then retrieved at a convenient time and in a convenient manner. A worker gathers test phase data by performing a phase test of line under test 160 using test meter 155. This information is obtained and recorded in the field, then later compared with the stored reference phase data. As long as reference meter 145 recorded reference phase data at a time that matched the time recorded on test meter 155 for test phase data, the phase of line under test 160 can be determined.

By extension, if one or more workers (using one or more test meters 155) gather test phase data at multiple lines under test 160, that test phase data is recorded in the field and later compared with the stored reference phase data. As long as reference meter 145 recorded reference phase data at times that matched at least one of the times recorded on test meter 155 for each test phase data, the phases of the lines under test 160 can be determined.

For in-field determination of the phase of line under test 160, a field worker performs a phase test. That is, the field worker connects test meter 155 to line under test 160 and gathers test phase data. The field worker calls a dispatcher or other worker at the site of reference meter 145 and relays the test phase data. The test phase data contains time stamp for start time t0 320 and a test interval (the phase time interval tx for line under test 160). The dispatcher enters the test phase data into reference meter 145, computer 165, or other instrument. The test phase data is compared to the stored reference phase data for the same start time to 320, and the unknown phase of line under test 160 is determined. The dispatcher then relays this phase information to the field worker, if required.

GPS receivers typically output a time mark at 1-second intervals. These time marks are locked to GPS time in seconds. This provides convenient time frames for reference meter 145 to take and record reference phase data. Test meter 155 used by the worker also collects test phase data at the same 1-second time mark as determined by its GPS receiver. The dispatcher's computer 165 or other instrument searches back through the recorded reference phase data to find the data collected at the same GPS second as the test phase data to determine the unknown phase.

Once both the reference and the test phase data have been gathered, the determination of phase of line under test 160 is readily made. Assume, for the sake of discussion, that reference meter 145 is connected to phase B, and that reference phase data indicates that the reference interval (the time interval from start time t0 320 to stop time tb 330) is 7.04 [8.45] milliseconds (152 degrees). Then, if the test phase data indicates that the test interval (the time interval from start time t0 320 to stop time tx) is 1.49 [1.78] milliseconds (32 degrees), then the phase of line under test 160 leads the phase of reference line 150 by 5.55 [6.67] milliseconds (120 degrees). The phase of line under test must therefore be phase A.

Note that since phases A, B, and C are separated by 120 degrees, it is not necessary to measure phase precisely to identify the unknown phase. If the unknown phase is within ±59 degrees of one of the reference phases, the unknown phase will be accurately determined. Electrical power at 60 [50] Hz propagates through distribution network 100 at slightly less than the speed of light. It therefore requires approximately 8.6 [10.4] miles (13.8 [16.7] kilometers) to obtain 1 degree of phase shift due to propagation. Therefore, a service radius around reference meter 150 of up to 120 [145] miles (193 [233] kilometers) is attainable. Assuming a 10-degree error budget, the service radius is at least 80 [97] miles (129 [156] kilometers).

A time uncertainty of 100 nanoseconds represents approximately 0.00216 [0.0018] degree of phase shift at 60 [50] Hz. GPS receivers determine time much more accurate than 100 nanoseconds. Therefore, GPS time uncertainty is simply not an issue in this application.

Figure 4:
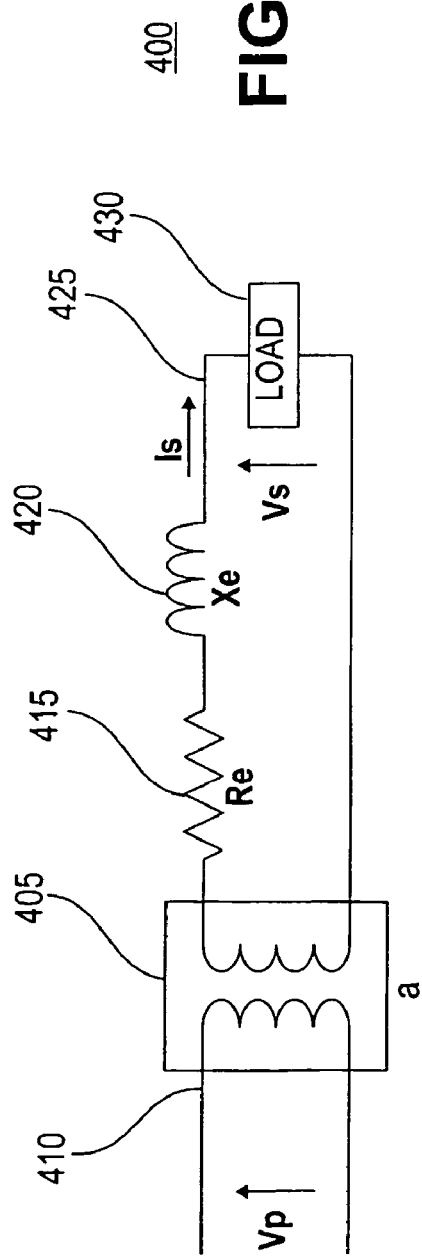
FIG. 4 is a schematic diagram of the equivalent circuit of a transformer referred to its secondary in accordance with a preferred embodiment of the present invention.
Figure 5:
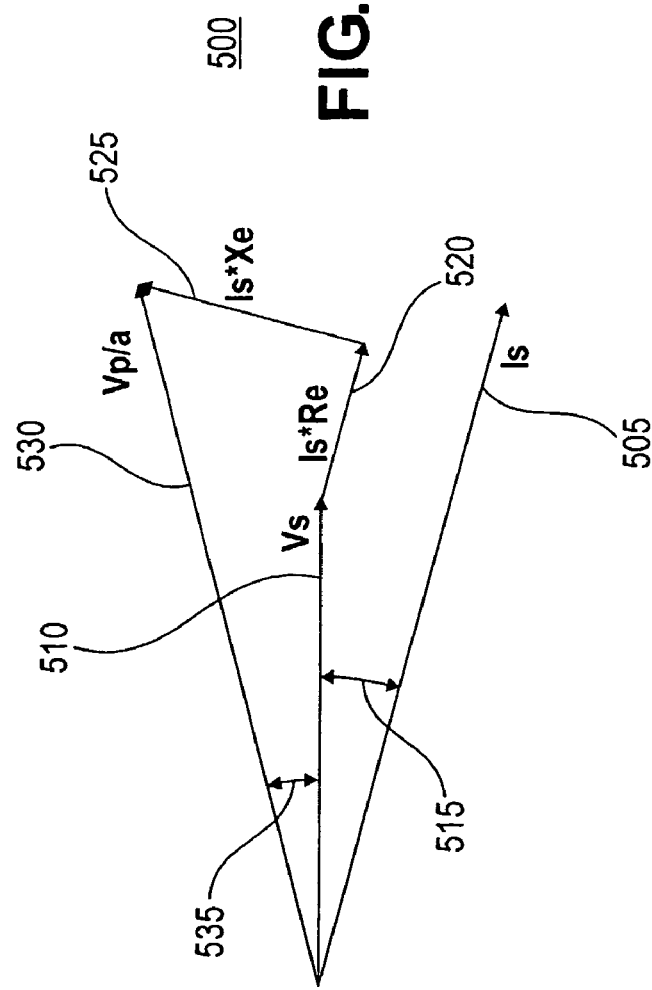
FIG. 5 is a phasor diagram of the circuit of FIG. 4 in accordance with a preferred embodiment of the present invention.

FIGS. 4 and 5 are a schematic diagram of an equivalent circuit 400 of a transformer and a phasor diagram 500 of circuit 400 in accordance with a preferred embodiment of the present invention. The following discussion refers to FIGS. 1, 4, and 5.

Another potential source of phase shift in network 100 (other than from power factor correction circuits) is the voltage phase shift that can occur in a transformer. In transformer equivalent circuit 400, the primary voltage Vp at an input terminal 410 produces secondary voltage Vs at an output terminal 425. A loss-free transformer 405 reduces the primary voltage Vp by the factor "a" based on the primary to secondary turns ratio. All transformer losses, referred to the secondary here, further reduce voltage Vs and cause its phase to be shifted with respect to primary voltage Vp. The secondary winding of transformer 405 has an inherent resistance Re and an inherent reactance Xe. The voltage drop due to transformer resistance Re is represented by current passing through resistor 415. The voltage drop due to transformer reactance Xe is represented by current passing through inductor 420.

Phasor diagram 500 has been greatly exaggerated to better illustrate how phase shift through a transformer occurs. When a lagging power factor load 430 is placed on the output of the transformer, secondary current Is, represented by phasor 505, flows out of phase with the secondary voltage Vs, represented by phasor 510 as is well known by those skilled in the art. The power factor phase shift 515 is determined by the power factor of the load 430.

The voltage drop due to Re is in phase with secondary current Is and is represented by phasor 520. The voltage drop due to Xe is 90 degrees out of phase with secondary current Is and is represented by phasor 525. The phasor addition of these voltage drops to secondary voltage Vs equals the loss-free turns ratio voltage Vp/a represented by phasor 530. Since no phase shift occurs through loss-free transformer 405, transformer phase shift 535 represents the voltage phase shift due to the transformer.

The phase shift through a transformer depends on the magnitude and power factor of the load current. However, in modern power distribution transformers, power losses are only a few percent so the resistive and reactive voltage drops are very small compared to their primary and secondary voltages. Therefore, voltage phase shift through the transformer is typically less than ±5 degrees.

The total voltage phase-error budget is ±59 degrees. The phase uncertainties due to propagation and GPS time tagging are less than ±10 degrees as was explained earlier. Therefore, nearly ±50 degrees of transformer phase shift can be tolerated before the accuracy of identifying the unknown phase is compromised. This large allowable phase uncertainty allows reference meter 145 and test meter 155 to be separated by many transformers. That is, phase A in network 100 is essentially the same everywhere in network 100, so reference meter 145 can be placed almost anywhere, including on the dispatcher's desk and plugged into a wall socket. The wall socket does not even have to be phase A. As long as reference meter 145 knows which phase is the reference phase, the phase identification method described here will work.

Figure 6:
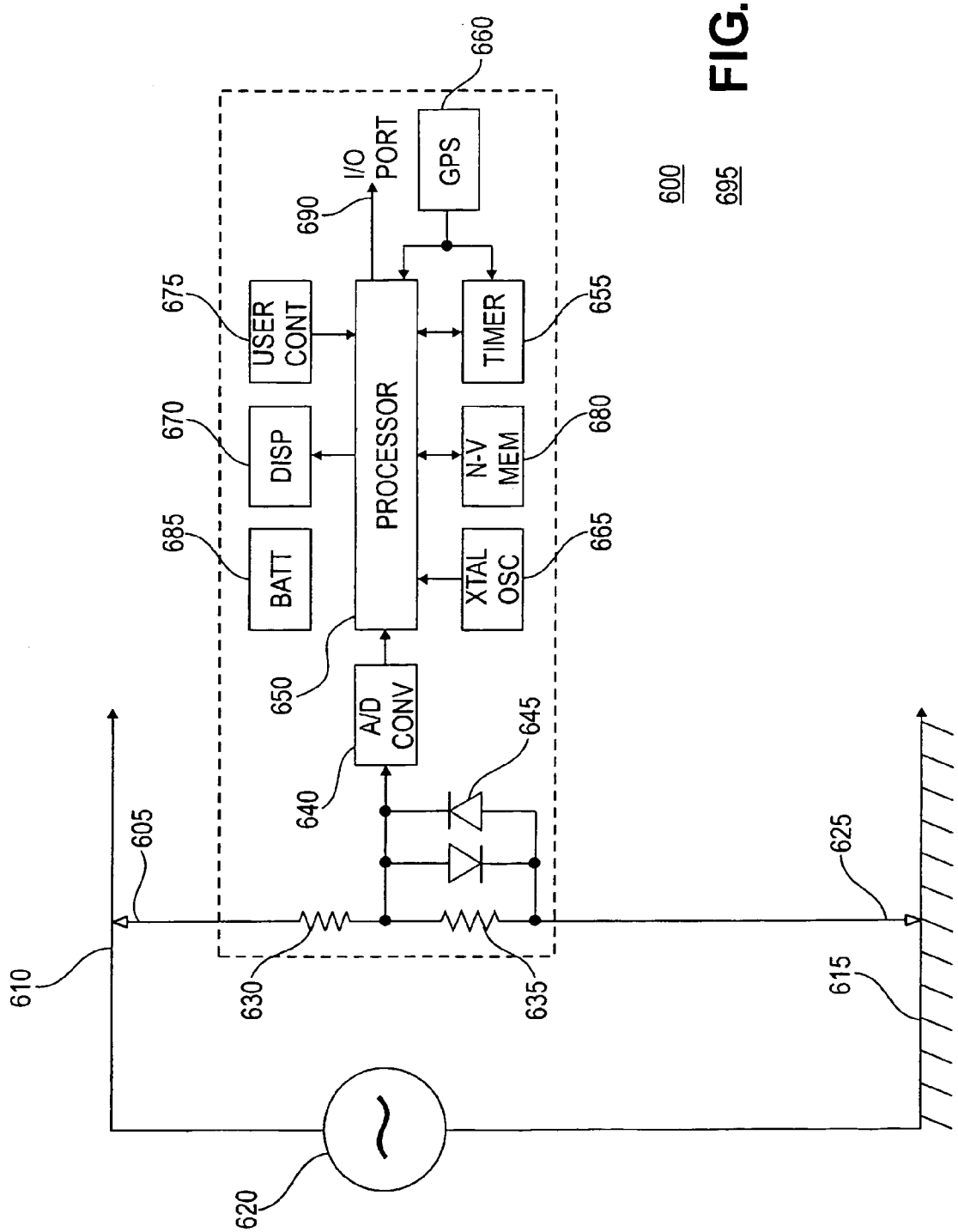
FIG. 6 is a conceptual block diagram of a phase identification meter in accordance with a preferred embodiment of the present invention.

FIG. 6 is a conceptual block diagram of a phase identification meter 600 in accordance with a preferred embodiment of the present invention. The following discussion refers to FIGS. 1 and 6.

Test meter 600 (test meter 155 in FIG. 1) may be used directly or attached to the end of a hot stick. A voltage probe 605 of test meter 600 is placed against line under test 610 (line under test 160 in FIG. 1). Line under test 610 is modeled as an AC voltage with respect to ground 615 by voltage source 620. Test meter 600 is connected to ground 615 through a grounding wire 625.

A voltage divider between line under test 610 and ground 615 is used. The voltage divider is formed of a high value line resistor 630, on the order of 10 megohms, in series with a low value ground resistor 635, on the order of 1 kilohm. Line resistor 630 connects to line under test 610 and ground resistor 635 connects to ground 615. The junction of line resistor 630 and ground resistor 635 connects to the input of an analog to digital (A/D) converter 640. By using a sensitive A/D converter 640, only a few millivolts of voltage from line under test 610 need be developed across ground resistor 635. Back to back voltage-clamping diodes 645 may be used to protect A/D converter 640 from damage due in the event of an overvoltage.

The heart of test meter 600 is a processor 650. Processor 650 contains a memory and computing resources. An interval timer 655 is configured to control and be controlled by processor 650. Interval timer 655 may be incorporated into processor 650. A/D converter 640 converts the line-under-test voltage into a digital signal. A 1-pulse-per-second (1-pps) signal is received by a GPS receiver 660, which then commands interval timer 655 to start. This is time t0. A transition of a predetermined voltage in a predetermined direction (a transition of zero volts from negative to positive in the preferred embodiment) of the line under test 160, as measured by A/D converter 640, causes processor 650 to stop interval timer 655. This is time tx. Processor 650 then records the time interval between t0 and tx, along with the GPS time 320 (FIG. 3) that initiated timer 655.

A measurement algorithm is programmed into processor 650 to ensure that only good measurement data is recorded and displayed. For example, after test probe 605 contacts line under test 610, test meter 600 may wait until the amplitude of the voltage across ground resistor 635 reaches a predetermined value before initiating the phase test. Test meter 600 may then perform phase tests at more than one GPS second and confirm that successive measurements produce similar test intervals based on the frequency of line under test 610. At 60 [50] Hz, exactly 60 [50] cycles occur each GPS second so that all test intervals should be identical. However, the power line frequency in power distribution network 100 may randomly vary from exactly 60 [50] Hz by a small amount (usually a few tenths of a percent or less). As long as successive test intervals are within the assumed tolerance, test phase data will be recorded and displayed, along with an indication to the worker that the measurement is completed.

To guard against loss of the 1-pps GPS signal, a crystal oscillator 665 may be locked to GPS receiver 660. Crystal oscillator 665 provides processor 650 with an accurate clock frequency so as to maintain the 1-pps signal during periods of GPS signal outages. This allows test meter 600 to be used inside cabinets or in other areas which may block reception of the GPS signal. A typical crystal oscillator 665 has a short-term accuracy on the order of 1 part per million (1 ppm). Since the phase of a 60 [50] Hz power line voltage rotates 1 degree per 46.3 [55.6] microseconds, it takes 46.3 [55.6] seconds for a clock that is in error by 1 ppm to accumulate 1 degree of phase uncertainty. For a 10-degree error budget, GPS receiver 660 could lose lock for 7.7 [9.3] minutes. Therefore, once GPS lock is obtained in a clear area, test meter 600 may be moved to a shielded area to obtain the phase measurement.

Other resources contained in the test meter 600 are display 670, user controls 675, non-volatile memory 680, battery 685, and input-output port 690. Display 670 may be a typical LCD meter display to display the phase information to the worker. User controls 675 include the on-off switch and any other buttons required to activate various features built into test meter 600. Battery 685 allows test meter 600 to operate independent of external power. Non-volatile memory 680 allows measurement data to be retained after test meter 600 is turned off. Input-output port 690 allows measurement information to be downloaded to computer 165.

It is anticipated that a mode will be offered in which GPS time is designated in terms of the number of seconds since the last GPS hour. That is, the number would range from 1 second to 3600 seconds. Also, the interval timer count could be quantified to increments of 1 degree. That is, the time duration between a GPS second and the first power line voltage negative to positive zero crossing would range between 1 and 360 degrees.

To make the phase data as short as possible, a single sequence could be used in which a number between 1 and 360 represents the phase interval collected during the first GPS second. A number between 361 and 720 represents the phase interval collected during the second GPS second, and so on. The largest possible number in this scheme would be equal to 3600 seconds times 360 degrees, or 1,296,000. This number could be expressed alphabetically (i.e., to base 26) where "A" equals 1, "B" equals 2, "Z" equals 26, "AA" equals 27, and so on to "BUSDD" equals 1,296,000. In this way, the largest hourly number could be represented using only five letters.

By extension, alphabetic encoding for a whole day would incorporate 3600 seconds per hour over 24 hours per day, or 86,400 seconds. This scheme would produce a largest possible number of 86,400 seconds times 360 degrees, which equals 31,104,000 or "BPAQKH". The largest daily number could therefore be represented using only six letters.

Reducing the phase data to only five or six letters minimizes the time it takes the worker to verbally communicate the sequence to the dispatcher and minimizes the time it takes the dispatcher to enter the sequence into reference meter 145 or computer 165. It also increases transcription accuracy in that the phonetic alphabet can be used to eliminate misunderstood letters or numbers. For example, the sequence "MHE" would be communicated phonetically as "Mike-Hotel-Echo."

Reference meter 145 (reference meter 695 in FIG. 6) is substantially identical to test meter 600 and operates in essentially the same manner. For reference meter 145, line under test 610 is reference line 150. Reference meter 145 will likely be "hard wired" to reference line 150, most likely through a conventional wall outlet. The voltage divider (series resistors 630 and 635) used in test meter 600 may be replaced by a step-down transformer (not shown). This is not a requirement of the present invention, however, and the use of such a transformer does not depart from the spirit of the present invention.

Reference meter 145 may also have more computing power and a larger memory, thereby enabling the storage of a multiplicity of reference phase data. Reference meter 145 and computer 165 may together form an integrated unit. In this case, reference meter 145 would have a keyboard to enter the test phase data obtained from the worker. Conversely, reference meter 145 and computer 165 may be separate units. Reference meter 145 may transfer all reference phase data to computer 165 in real time or upon demand. If so, a software program running on computer 165 might handle all phase data storage and identification-functions.

In a large metropolitan area, multiple reference meters 145 might be used at various locations for redundancy and reliability cross checking. Also, if it is found that a significant phase shift occurs in certain branches due to power-factor correction circuits or other causes, that information can be entered into a database for reference meter 145. To take those phase shifts into account, the dispatcher would have to enter information identifying the branch circuit of line under test 160 along with the unknown phase data. Computer 165 would then remove the known phase offset in making the determination of the unknown phase on that branch circuit.

Figure 8:
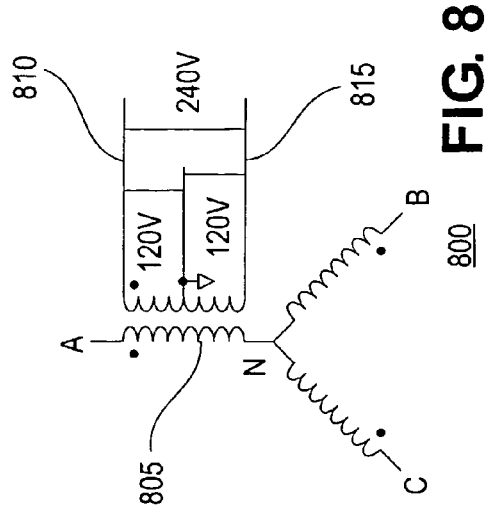
FIG. 8 is a schematic of a wye-connected transformer in accordance with a preferred embodiment of the present invention.
Figure 9:
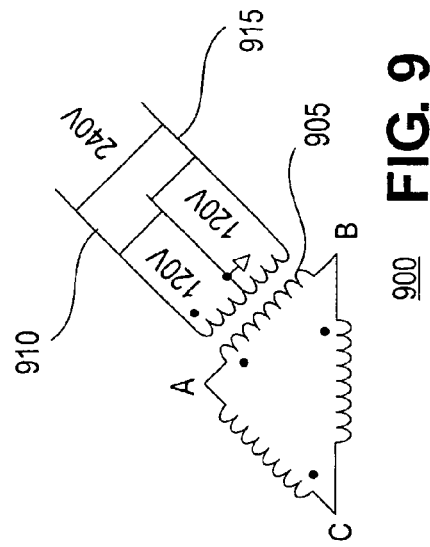
FIG. 9 is a schematic of a delta-connected transformer in accordance with a preferred embodiment of the present invention.
Figure 7:
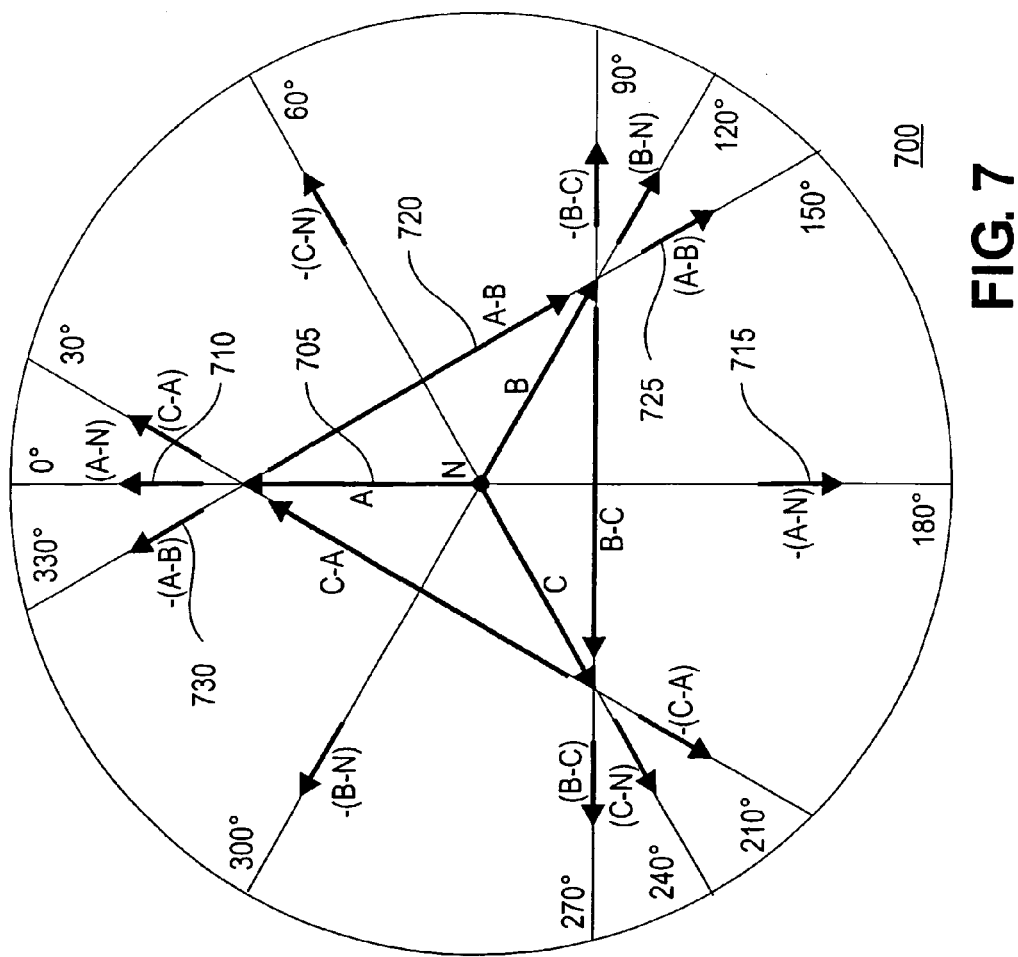
FIG. 7 is a phasor diagram of secondary voltage phase relationships in a three-phase power network for wye- and delta-connected transformers in accordance with a preferred embodiment of the present invention.

FIG. 7 is a phasor diagram 700 of secondary voltage phase relationships in a three-phase power network for wye- and delta-connected transformers, and FIGS. 8 and 9 are schematics of a wye-connected transformer 800 and a delta-connected transformer 900 in accordance with a preferred embodiment of the present invention. The following discussion refers to FIGS. 1, 7, 8, and 9.

Relative phase measurements taken on the phase A, B, or C primary voltages will always be close to one of three reference phase angles which are separated by 120 degrees. However, relative phase measurements taken on secondary voltages can be separated by only 30 degrees. Phasor diagram 700 represents the twelve different secondary phases that can be obtained on wye and delta connected transformers.

The most common transformer connection in power distribution network 100 is the four-wire wye arrangement depicted in schematic 800. In a wye configuration, three-phase power is transported using a wire for each of the three phases A, B, and C, plus a fourth center-connected ground wire. In a wye arrangement, therefore, the primary side of each single-phase PM transformer is connected between one of the three primary phases and ground. A secondary winding having a grounded center tap supplies 120 and 240 volts to the commercial or residential customer. Because of the center-tapped ground, only one of the 120-volt outputs is in phase with the primary winding phase. The other 120-volt output is 180 degrees out of phase with the primary winding phase.

Referring to phasor diagram 700 and wye-connected transformer 800, the primary winding 805 is connected between phase A and ground (phasor 705). One 120-volt output 810 (phasor 710) is in phase with primary phase A, and the other 120-volt secondary output 815 (phasor 715) is out of phase with primary phase A. Therefore, when test meter 155 is applied to secondary voltages derived from phase A of wye-connected transformer 800, the measured phase will be either 0 or 180 degrees with respect to phase A. In a similar manner, for secondary voltages derived from phase B, the measured phase will be either 120 or 300 degrees, and for secondary voltages derived from phase C, the measured phase will be either 240 or 60 degrees.

An alternative transformer connection in power distribution network 100 is the three-wire delta arrangement depicted in schematic 900. In a delta configuration, three-phase power is transported using a wire for each of the three phases A, B, and C without a center-connected ground wire. In a delta arrangement, therefore, the primary side of each single-phase PM transformer is connected between two of the three primary phases, i.e., between phases A and B, phases B and C, or between phases C and A. Again, a secondary winding having a grounded center tap supplies 120 and 240 volts to the commercial or residential customer. Because of the center-tapped ground, only one of the 120-volt outputs is in phase with the primary winding phase. The other 120-volt output is 180 degrees out of phase with the primary winding phase.

Referring to phasor diagram 700 and delta-connected transformer 900, the primary winding 905 is connected between phases A and B (phasor 720). One 120-volt output 910 (phasor 725) is in phase with the primary winding, and the other 120-volt secondary output 915 (phasor 730) is out of phase with the primary winding. Therefore, when test meter 155 is applied to secondary voltages derived from phases A and B of delta-connected transformer 900, the measured phase will be either 150 or 330 degrees with respect to phase A. In a similar manner, for secondary voltages derived from phases B and C, the measured phase will be either 270 or 90 degrees, and for secondary voltages derived from phase C and A, the measured phase will be either 30 or 210 degrees.

Using test meter 155 on the outputs of wye-connected and delta-connected transformers reduces the total phase error budget from ±59 degrees to ±14 degrees. However, phase measurement tests made at widely separated points on an actual power distribution network 100 indicate that actual phase errors are much less than 14 degrees (they were actually less than 5 degrees). Identifying line phase by measuring secondary voltages is preferable by utilities to measuring primary voltages because it can be performed by personnel that are not high-voltage certified. An accessory attachment may be supplied with the phase identification meter to allow it to be simply plugged into any commercial or residential wall socket to determine which primary phase powers the facility.

Although the preferred embodiments of the invention have been illustrated and described in detail, it will be readily apparent to those skilled in the art that various modifications may be made therein without departing from the spirit of the invention. This is especially true in the area of user features.

For example, to speed up measurements on a series of overhead lines, test phase data from multiple phase test may be automatically stored in test meter 155. Each new phase test would be initiated upon detection of new power line voltage that occurs a few seconds after the previous power line voltage terminates. This feature would allow the worker to perform phase tests on a number of high overhead lines without having to retrieve test meter 155 after each phase test.

It is also possible to capacitively couple probe 605 of test meter 600 to line under test 610, instead of actually touching bare wire, if the actual or estimated phase shift is accounted for. This feature would allow test meter 600 to be used on insulated lines.

To limit maximum propagation phase error, test meters 600 could be programmed to only operate inside a designated service area. Location coordinates from GPS receivers 660 could be compared to a map programmed into the processors 650 of each meter 600 to determine if that meter 600 was inside the service area.

Many different ways of communicating the test phase data from test meter 155 to reference meter 145 or computer 165 are possible. The test phase data could be called in using terrestrial, cellular, or other radio telephony, (e.g., a landline telephone, a cellular telephone, or a utility radio) over a voice link. A modem or other computer could be used to send or E-mail the test phase data over a data link. The test phase data could be simply written down and delivered by courier, mail, or personally by the worker. The test phase data could be recorded within test meter 155 and downloaded to computer 165 at the end of the work shift. It will be understood that the use of any given methodology to convey test phase data from test meter 155 to reference meter 145 or computer 165 does not depart from the spirit of the present invention.

Alternatively, one or more reference phase data could be delivered to the test location and the unknown line phase determined using either test meter 155 or a test-location computer. Again, many different ways of communicating the reference phase data to test meter 155 or the test location computer are possible. The test location computer could query the reference location computer 165 for the required reference phase data or it could automatically receive and store all new reference phase data as they became available. A collection of the most current (last minute) reference phase data could be continuously broadcast to a receiver within test meter 155 and the unknown line phase determined automatically using test meter 155. The broadcast could be via FM subcarrier on a local FM station or satellite.

Because the phase data (the start time identifications and the phase measurement intervals) are delivered to computer 165 (which may be incorporated into either reference meter 145 or test meter 155), computer 165 lends itself to the development of a database containing the phase data, especially the reference phase data. With such a reference database, upon the arrival of test phase data, computer 165 would then retrieve from the database the reference phase data having the same start time identification for computation of the unknown line phase (the phase of line under test 160).

Additionally, if the test phase data also contains an identification of line under test 160 (i.e., a branch and/or circuit number uniquely identifying line under test 160), then the database may be expanded (or another database may be created) to contain the identification and phase of each line under test 160. This database would normally be filled using survey techniques. The existence of a given line under test 160 in this database would preclude the necessity of future phase testing of that line.

In all these techniques, it is important to understand that a real time communication link is not required. As long as the reference meter data is saved, the time period, between obtaining the test meter phase identification sequence and comparing it to the reference meter data, could be hours, days, weeks, or months.

Although the preferred embodiments of the invention have been illustrated and described in detail, it will be readily apparent to those skilled in the art that various modifications may be made therein without departing from the spirit of the invention or from the scope of the appended claims.

What is claimed is:

1. An apparatus for identifying a phase of a power line in a three-phase power distribution network (100), said apparatus comprising:
    a reference phase identification meter (145,695) coupled to a reference line (150) at a first location in said network (100) and configured to gather reference phase data relative to said reference line (150) at a predetermined time (320);
    a test phase identification meter (155,600) coupled to a line under test (160,610) at a second location in said network (100) and configured to gather test phase data relative to said line under test (160,610) at said predetermined time (320); and
    a computer (165) configured to establish communication with said test phase identification meter (155) after said test phase identification meter (155) has gathered said test phase data, configured to receive said test phase data from said test phase identification meter (155), and configured to identify a phase of said second line (160) in response to said test phase data from said test phase identification meter (155) and said reference phase data from said reference phase identification meter (145).

2. An apparatus as claimed in claim 1 wherein said reference phase identification meter (695) comprises:
    a processor (650) configured to gather said reference phase data;
    a receiver (660) coupled to said processor (650) and configured to cause said processor (650) to start gathering said reference phase data at said predetermined time; and
    an analog to digital (A/D) converter (640) coupled between said reference line (150) and said processor (650), and configured to cause said processor (650) to stop gathering said reference phase data.

3. An apparatus as claimed in claim 1 wherein said test phase identification meter (600) comprises:
    an analog to digital (A/D) converter (640) coupled to said line under test (610);
    a processor (650) coupled to and configured to control said A/D converter (640);
    a timer (655) coupled to said processor (650) and configured to be controlled by said A/D converter (640) through said processor (650); and
    a receiver (660) coupled to said processor (650) and configured to control said timer (655).

4. An apparatus as claimed in claim 3 wherein said receiver (660) is configured to synchronize said timer (655) to a time signal.

5. An apparatus as claimed in claim 3 wherein:
    said receiver (660) is configured to cause said processor (650) to start gathering said phase data at a start time (320), said start time (320) being said predetermined time (320);
    said A/D converter (640) is configured to cause said processor (650) to stop gathering said phase data at a stop time, said stop time being when a voltage on said line under test (610) crosses zero in a predetermined direction; and
    said phase data comprises:
        said start time (320); and
        a time interval between said start time (320) and said stop time.

6. An apparatus as claimed in claim 1 wherein said test phase identification meter (600) additionally comprises:
    a timer (655);
    a receiver (660) configured to receive a time signal and synchronize said timer (655) to said time signal; and
    a crystal oscillator (665) configured to track said time signal and synchronize said timer (655) to said time signal when said receiver (660) is not receiving said time signal.

7. An apparatus as claimed in claim 1 wherein said test phase identification meter (600) comprises:
    an analog to digital (A/D) converter (640) coupled to said line under test (610);
    a processor (650) coupled to and configured to control said A/D converter (640);
    a timer (655) coupled to said processor (650) and configured to be controlled by said A/D converter (640) through said processor (650); and
    a GPS receiver (660) coupled to said processor (650), configured to synchronize said timer (655) to a GPS time signal, and configured to establish a start time (320) for said timer (655) when said GPS receiver (660) is receiving said GPS time signal.

8. An apparatus as claimed in claim 1 wherein:
    said reference line (150) has a known phase;
    said line under test (160) has an unknown phase; and
    said computer (165) is configured to identify said unknown phase by comparing said test phase data to said reference phase data.

9. An apparatus as claimed in claim 1 wherein said computer (165) and said reference phase identification meter (145) together comprise an integrated unit.

10. An apparatus as claimed in claim 1 wherein said first location is within 120 miles (193 kilometers) of said second location.

11. An apparatus as claimed in claim 1 wherein:
    said reference phase identification meter (145) and said test phase identification meter (155) receive repetitive trigger signals;

to conduct a single phase test, said reference phase identification meter (145) records phase data for each of said repetitive trigger signals; and to conduct a single phase test, said test phase identification meter (155) records phase data for one of said repetitive trigger signals.

12. An apparatus as claimed in claim 11 wherein said phase data contains a trigger-signal identification and a phase interval.

13. An apparatus as claimed in claim 11 wherein said test phase identification meter (155) is configured to record said phase values for a plurality of tests prior to establishing communication with said computer (165).

14. An apparatus as claimed in claim 1 wherein:
said three-phase power distribution network (100) comprises:
  a first phase;
  a second phase lagging said first phase by 120 degrees; and
  a third phase lagging said first phase by 240 degrees;
said reference phase data comprises a first interval;
said test phase data comprises a second interval;
a difference of said first and second intervals corresponds to an angular displacement; and
said phase of said reference line (150) lags said first phase by 0 degrees.

15. An apparatus as claimed in claim 14 wherein:
said line under test (160) is a single-phase secondary output (810,815) coupled to one leg of a wye-connected transformer (800);
a phase of said one leg is said first phase when said angular displacement of said line under test (160) is one of 0 degrees and 180 degrees;
a phase of said one leg is said second phase when said angular displacement of said line under test (160) is one of 120 degrees and 300 degrees; and
a phase of said one leg is said third phase when said angular displacement of said line under test (160) is one of 240 degrees and 60 degrees.

16. An apparatus as claimed in claim 14 wherein:
said line under test (160) is a single-phase secondary output (910,915) coupled to one leg of a delta-connected transformer;
said one leg is coupled between said first and second phases when said angular displacement of said line under test (160) is one of 150 degrees and 330 degrees;
said one leg is coupled between said second and third phases when said angular displacement of said line under test (160) is one of 270 degrees and 90 degrees; and
said one leg is coupled between said third and first phases when said angular displacement of said line under test (160) is one of 30 degrees and 210 degrees.

17. A method for identifying a phase of a line in a three-phase power distribution network (100), said method comprising:
a) connecting a first phase identification meter (145) to a first line (150) at a first point in said power distribution network (100);
b) measuring, with said first phase identification meter (145), a first interval between a start time (320) and a first stop time;
c) connecting a second phase identification meter (155) to a second line (160) at a second point in said power distribution network (100);
d) measuring, with said second phase identification meter (155), a second interval between said start time (320) and a second stop time;
e) recording said second interval in said second phase identification meter (155);
f) holding said second interval in said second phase identification meter (155) for greater than one second;
g) establishing a communication link;
h) communicating one of said first and second intervals over said communication link after said measuring, recording, and holding activities d), e), and f);
i) computing said phase of said second line (160) in response to said first and second intervals.

18. A method
for identifying a phase of a line in a three-phase power distribution network (100), said method comprising:
a) connecting a first phase identification meter (145) to a first line (150) at a first point in said power distribution network (100);
b) measuring, with said first phase identification meter (145), a first interval between a start time (320) and a first stop time;
c) recording said first interval after said measuring activity b);
d) iterating said measuring activity b) and said recording activity c) a plurality of times;
e) connecting a second phase identification meter (155) to a second line (160) at a second point in said power distribution network (100);
f) measuring, with said second phase identification meter (155), a second interval between said start time (320) and a second stop time;
g) recording said second interval after said measuring activity f);
h) iterating said measuring activity f) and said recording activity g);
i) establishing a communication link;
j) communicating communicates said recorded second intervals over said communication link after said measuring activity f); and
k) computing, for each of said recorded second intervals, said phase of said second line (160) in response to said each of said recorded second intervals and one of said recorded first intervals.

19. A method
for identifying a phase of a line in a three-phase power distribution network (100), said method comprising:
a) connecting a first phase identification meter (145) to a first line (150) at a first point in said power distribution network (100);
b) measuring, with said first phase identification meter (145), a first interval between a start time (320) and a first stop time;
c) recording said first interval after said measuring activity b);
d) iterating said measuring activity b) and said recording activity c) a plurality of times to generate a plurality of said first intervals;
e) connecting a second phase identification meter (155) to a second line (160) at a second point in said power distribution network (100);
f) measuring, with said second phase identification meter (155), a second interval between said start time (320) and a second stop time;
g) recording said second interval after said measuring activity f); and h) iterating said measuring activity f) and said recording activity g);
i) establishing a communication link;
j) communicating said second intervals over said communication link after said measuring activity f); and
k) computing for each of said second intervals, said phase of said second line (160) in response to said each of said second intervals and one of said plurality of first intervals.

20. A method
for identifying a phase of a line in a three-phase power distribution network (100), said method comprising:
a) connecting a first phase identification meter (145) to a first line (150) at a first point in said power distribution network (100);
b) measuring, with said first phase identification meter (145), a first interval between a start time (320) and a first stop time;
c) connecting a second phase identification meter (155) to a second line (160) at a second point in said power distribution network (100);
d) measuring, with said second phase identification meter (155), a second interval between said start time (320) and a second stop time;
e) establishing a communication link;
f) communicating one of said first and second intervals over said communication link after said measuring activity a); activity d);
g) computing said phase of said second line (160) in response to said first and second intervals;
establishing a data link between said second phase identification meter (155) and a computer (165); and
said communicating activity f) communicates said second interval to said computer (165) via said data link.

21. A method as claimed in claim 20 wherein said communicating activity f) communicates said one of said first and second intervals to a computer (165).

22. A method as claimed in claim 20 additionally comprising recording said second interval in said second phase identification meter (155) prior to said communicating activity f).

23. A method as claimed in claim 22 additionally comprising iterating said measuring activity d) and said recording activity prior to said communicating activity f).

24. A method as claimed in claim 20 wherein:
said method additionally comprises:
h) recording said first interval after said measuring activity b);
i) iterating said measuring activity b) and said recording activity h) a plurality of times; and
j) recording said second interval after said measuring activity d); and
said computing activity g) computes said phase of said second line (160) in response to said recorded second interval and one of said recorded first intervals.

25. A method as claimed in claim 20 additionally comprising:
h) determining, substantially coincidentally with said measuring activity b), a first time stamp;
i) iterating said measuring activity b) and said determining activity h) a plurality of times to generate a plurality of first phase data, wherein each of said first phase data contains said first time stamp and said first interval;
j) recording said plurality of first phase data; and
k) maintaining a database of said plurality of first phase data.

26. A method as claimed in claim 25 additionally comprising:
l) determining, substantially coincidentally with said measuring activity d), a second time stamp;
m) producing a second phase data from said second time stamp and said second interval;
n) recording said second phase data; and
o) identifying a match between said second time stamp within said second phase data and a first time stamp contained within one of said plurality of first phase data in said database.

27. A method as claimed in claim 20 wherein:
said method additionally comprises establishing a voice link; and
said communicating activity f) communicates said second interval via said voice link.

28. A method as claimed in claim 27 wherein said voice link incorporates cellular telephony.

29. A method as claimed in claim 20 wherein:
said measuring activity b) measures said first interval between said start time (320) and said first stop time when a voltage on said first line (150) passes through a first predetermined voltage in a first predetermined direction; and
said measuring activity d) measures said second interval between said start time (320) and said second stop time when a voltage on said second line (160) passes through a second predetermined voltage in a second predetermined direction.

30. A method as claimed in claim 20 additionally comprising synchronizing said start time (320) in said first and second phase identification meters (145,155) via a satellite-derived time signal.

31. A method as claimed in claim 20 additionally comprising synchronizing said start time (320) in said first and second phase identification meters (145,155) via a time signal of the Global Positioning System.

32. A method as claimed in claim 20 wherein said computing activity g) comprises:
establishing as a reference phase that phase of said three-phase power distribution network (100) present on said first line (150);
establishing as a lagging phase that phase of said three-phase power distribution network (100) that lags said reference phase by 120 degrees;
establishing as a leading phase that phase of said three-phase power distribution network (100) that leads said reference phase by 120 degrees;
establishing as an unknown phase that phase of said three-phase power distribution network (100) present on said second line (160);
determining said unknown phase to be said reference phase when said second interval is substantially equal to said first interval;
determining said unknown phase to be said lagging phase when said second interval is longer than said first interval by substantially 120 degrees;
determining said unknown phase to be said lagging phase when said second interval is shorter than said first interval by substantially 240 degrees;
determining said unknown phase to be said leading phase when said second interval is longer than said first interval by substantially 240 degrees; and
determining said unknown phase to be said leading phase when said second interval is shorter than said first interval by substantially 120 degrees.

33. A method for identifying a phase of a line in a three-phase power distribution network (100), said method comprising:
  a) connecting a first phase identification meter (145) to a first line (150) at a first point in said power distribution network (100);
  b) measuring, with said first phase identification meter (145), a first interval between a start time (320) and a first stop time;
  c) connecting a second phase identification meter (155) to a second line (160) at a second point in said power distribution network (100);
  d) measuring, with said second phase identification meter (155), a second interval between said start time (320) and a second stop time;
  e) establishing a communication link;
  f) communicating one of said first and second intervals over said communication link after said measuring activity d);
  g) computing said phase of said second line (160) in response to said first and second intervals;
  h) mapping a service area of said power distribution network (100);
  i) storing said map within one of said first and second phase identification meters (145,155); and
  j) determining if said one of said first and second phase identification meters (145,155) is within said service area.

34. A phase identification meter (600) for identifying a phase of a power line in a three-phase power distribution network (100), said phase identification meter (600) comprising:
  a Global Positioning System (GPS) receiver (660) configured to generate a start time (320) as a predetermined GPS time;
  an analog to digital (A/D) converter (640) configured to generate a stop time when an input voltage from said power line crosses zero in a predetermined direction; and
  a processor (650) coupled to said A/D converter (640) and said GPS receiver (660), and configured to determine a time interval between said start time (320) and said stop time.

35. A method for identifying a phase of a line under test (160) in a three-phase power distribution network (100), said method comprising:
  a) connecting a reference phase identification meter (145) to a reference line (150) at a first point in said power distribution network (100);
  b) connecting a test phase identification meter (155) to said line under test (160) at a second point in said power distribution network (100);
  c) repetitively measuring, with said reference phase identification meter (145), an instantaneous reference phase of said reference line (150) at each of a series of predetermined instants in time to produce a plurality of said instantaneous reference phases;
  d) measuring, with said test phase identification meter (155), an instantaneous test phase of said line under test (160) at said predetermined instant in time, wherein said predetermined instant in time is one of said series of predetermined instants in time;
  e) computing said phase of said line under test (160) in response to one of said plurality of instantaneous reference phases, said instantaneous test phase, and said one of said series of predetermined instants in time;
  f) recording said plurality of instantaneous reference phases in association with said series of predetermined instants in time;
  g) recording said instantaneous test phase in association with said one of said series of predetermined instants in time; and
  h) communicating said instantaneous test phase and said one of said series of predetermined instants in time after said measuring activity d).

36. A method as claimed in claim 35 wherein said predetermined instant in time is a predetermined Global Positioning System (GPS) time (320).

37. A method as claimed in claim 35 wherein said series of predetermined instants in time is a uniform series of consecutive Global Positioning System (GPS) times (320).

* * * * *

UNITED STATES PATENT AND TRADEMARK OFFICE
CERTIFICATE OF CORRECTION

| | | |
|---|---|---|
| PATENT NO. | : 7,031,859 B2 | Page 1 of 1 |
| APPLICATION NO. | : 10/492921 | |
| DATED | : April 14, 2006 | |
| INVENTOR(S) | : Gregory H. Piesinger | |

It is certified that error appears in the above-identified patent and that said Letters Patent is hereby corrected as shown below:

In column 6 at line 24, replace "to" with --t0--.

In column 17, at line 19 of claim 20, replace "activity a); activity d);" with --activity d);--.

Signed and Sealed this

Fourteenth Day of November, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,031,859 B2 | Page 1 of 1 |
| APPLICATION NO. | : 10/492921 | |
| DATED | : April 18, 2006 | |
| INVENTOR(S) | : Gregory H. Piesinger | |

It is certified that error appears in the above-identified patent and that said Letters Patent is hereby corrected as shown below:

In column 6 at line 24, replace "to" with --t0--.

In column 17, at line 19 of claim 20, replace "activity a); activity d);" with --activity d);--.

This certificate supersedes Certificate of Correction issued November 14, 2006.

Signed and Sealed this

Second Day of January, 2007

JON W. DUDAS
*Director of the United States Patent and Trademark Office*